United States Patent [19]

Gougouyan et al.

[11] Patent Number: 4,480,045

[45] Date of Patent: Oct. 30, 1984

[54] ALUMINA-BASED CERAMIC COMPOSITION AND SUBSTRATE OBTAINED BY MEANS OF THIS COMPOSITION

[75] Inventors: Yves Gougouyan; Philippe Basseville, both of Bagnolet, France

[73] Assignee: L.C.C.-C.I.C.E.-Compagnie Europeenne de Composants Electroniques, Bagnolet, France

[21] Appl. No.: 587,855

[22] Filed: Mar. 14, 1984

Related U.S. Application Data

[63] Continuation of Ser. No. 452,125, Dec. 22, 1982, abandoned.

[30] Foreign Application Priority Data

Jan. 12, 1982 [FR] France .................................. 82 00373

[51] Int. Cl.$^3$ ............................................ C04B 35/10
[52] U.S. Cl. ..................................................... 501/153
[58] Field of Search ....................... 501/119, 127, 153; 264/67

[56] References Cited

U.S. PATENT DOCUMENTS

| | | | |
|---|---|---|---|
| 3,698,923 | 10/1972 | Stetson et al. | 501/153 |
| 3,854,965 | 12/1974 | Niwa et al. | 501/153 |
| 4,045,412 | 8/1977 | Yamada et al. | 501/119 |
| 4,217,337 | 8/1980 | Yamada et al. | 501/153 |

*Primary Examiner*—James Poer

[57] ABSTRACT

Ceramic composition containing alumina, a deflocculating agent and at least one organic binder. According to the invention it is constituted, in dry extract form, by 95 to 99% by weight of a mixture of a first alumina of grain size below 2 microns, which can be fritted at a temperature below 1600° C. for a bulk density below 2.3 and a second alumina of grain size below 3 microns, which can be fritted at a temperature below 1650° C. for a bulk density below 2.4 and 1 to 5% by weight of organic products containing at least one deflocculating agent and at least one binder chosen from among the alkyl polyacrylates and their copolymers.

3 Claims, 2 Drawing Figures

ALUMINA-BASED CERAMIC COMPOSITION AND SUBSTRATE OBTAINED BY MEANS OF THIS COMPOSITION

This is a continuation of application Ser. No. 452,125, filed on Dec. 22, 1982, now abandoned.

BACKGROUND OF THE INVENTION

The present invention relates to an alumina-based ceramic composition and to a substrate obtained by pressing using this composition.

At present, ceramic substrates are used in the electronics industry, particularly for producing chip-carriers or as carriers for hybrid circuits. On these substrates are formed systems of electrical connections making it possible to connect the components, such as integrated circuits, to the electrical elements of the apparatus in which the ceramic substrate is fitted. These systems of the electrical connections are generally produced in accordance with either the thick layer procedure (e.g. by a screen process printing method) or by the thin layer procedure (e.g. by a vacuum deposition method). The first of these procedures can be used in all cases, but particularly when the average roughness of the substrate is relatively high (above 10 micro-inch), whilst the second can only be used for substrates having a limited roughness. The first procedure is easier and more economic to perform, but does not make it possible to obtain fine patterns.

Among the industrial solutions for producing ceramic compositions for forming substrates, namely casting or moulding, mechanical pressing and isostatic pressing, the second is more particularly favoured as a result of its simplicity, particularly when it is a question of directly producing members which can be fritted in a furnace. Thus, as the member is directly moulded, the cutting stage which exists in both the casting process and in isostatic pressing process is avoided, as well as any possible operations involving the perforation of the member as a result of designing the mould in an adequate manner. It is merely necessary to provide in the mould, pins corresponding to the holes in the substrate. This particularly economic process does not, however, make it possible to directly produce ceramic substrates of the "thin layer" type with the well known ceramic compositions. Thus, the members obtained are much too rough and it is necessary to grind the surface of the substrate in order to make it suitable for the deposition of thin layers.

It is known from French Pat. No. 1 388 155 to use deflocculating agents in alumina-based ceramic compositions in order to make them suitable for mechanical or isostatic pressing. This patent also describes the addition of a certain quantity of binders, which ensure that the pressed object has a certain "hold" and does not deform during the fritting operation. However, the compositions described in this patent do not make it possible to produce members with a complicated shape having a limited roughness after fritting, i.e. below 10 micro-inch, without a mechanical grinding operation. It has in particular been found that the use of the different compositions described in this patent do not make it possible to obtain ceramic substrates with a limited roughness and which have holes made directly during the mechanical pressing process.

BRIEF SUMMARY OF THE INVENTION

The ceramic composition according to the invention makes it possible to solve this problem and directly obtain mechanically pressed members having a limited roughness. The invention therefore specifically relates to a ceramic composition wherein it is constituted, as a dry extract, by 95 to 99% by weight of a mixture of a first alumina having a grain size below 2 microns, which can be fritted at a temperature below 1600° C. for a bulk density below 2.3 and a second alumina of grain size below 3 microns, which can be fritted at a temperature below 1650° C. for a bulk density below 2.4 and 1 to 5% by weight of organic products incorporating at least one deflocculating agent and at least one acrylic binder.

Preferably, the first alumina has a grain size between 0.4 and 0.8 micron, a bulk density between 2.00 and 2.20, a finished density between 3.85 and 3.96 and a fritting temperature between 1450° and 1580° C., whilst the second alumina has a grain size between 1.2 and 1.6 microns, a bulk density between 2.20 and 2.30, a finished density between 3.85 and 3.96 and a fritting temperature between 1580° and 1650° C. (The term grain size equal to a certain value means that approximately 90% of the grains have a size below this value).

Preferably, better results are obtained (low roughness, ease of producing the composition), by using 97 to 98.5% by weight of the alumina mixture and 1.5 to 3% by weight of organic products. The alumina mixture generally contains 65 to 95% by weight of the first alumina and 35 to 5% by weight of the second, the best results from the substrate roughness standpoint being obtained for an alumina mixture incorporating 70 to 80% by weight of the first alumina and 30 to 20% by weight of the second.

In order to be able to carry out the mechanical pressing of the composition according to the invention, the latter must incorporate organic binders of the acrylic type, like those used in paints, whereby these binders must be compatible with water, because the slips using the ceramic compositions are always water-based. It has in fact been found that the use of acrylic binders such as homopolymers or copolymers based on alkyl polyacrylates in general and more particularly butyl polyacrylate in the form of a homopolymer or copolymerized with acrylonitrile makes it possible to obtain readily mechanically pressable compositions, whilst using the aforementioned muxture of aluminas. The substrates obtained after fritting have a limited roughness. The best mechanical pressing results are obtained with a quantity of acrylic binders between 1 and 3% by weight, based on the total weight of the composition.

The ceramic compositions according to the invention can also contain 0 to 5% by weight of mineral additives conventionally used in ceramics such as calcium oxides, magnesium, metallic oxides, silica, etc., the properties of these oxides being well known to the Expert. The best results from the roughness standpoint are obtained by adding 0 to 1% by weight of these mineral additives to the aforementioned compositions. The grain size is preferably below 2 microns. Reference can be made to French Patent No. 1 388 155 for further details regarding the ceramic compositions conventionally used and their preparation, as well as the additives used.

For forming a ceramic substrate of the thin layer type by mechanical pressing using the composition according to the invention, firstly a granulated material is prepared in per se known manner. It is conventional practice to use an alumina ball mill in which the different constituents according to the invention are homogeneously mixed. The quantity of water is such that the composition, as a dry extract, represents 50 to 75% by weight of the slip obtained. After a grinding period which is sufficiently long to bring about a homogeneous mixture, the slip is introduced into an atomizer so as to produce a granulated material, which is then screened to obtain a maximum particle diameter below 500 microns and preferably below 300 microns. This granulated material is then introduced in an adequate quantity directly into the mould and pressed, the member obtained being fritted at a temperature of approximately 1600° C. In the case of producing ceramic substrates of the thin layer type, these then undergo grinding in a drum in which there is autoabrasion in an aqueous medium of the different substrates.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
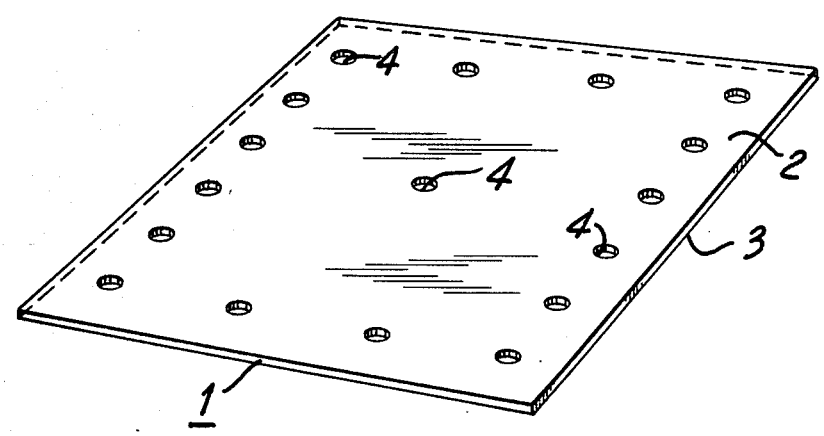
FIG. 1 a diagrammatic view of a ceramic substrate obtained by mechanical pressing with a composition according to the invention.

FIG. 1 shows a known ceramic substrate, but which could not hitherto be obtained with a limited roughness by mechanical pressing. Substrate 1 has two parallel faces 2 and 3 perforated by a plurality of holes 4. In the prior art, these holes 4 are obtained by perforating a rough substrate obtained by casting and then cutting. According to the invention, these holes 4 can be directly obtained during the moulding process. For this purpose it is merely necessary to use e.g. a mould with the shape shown in FIG. 2.

Figure 2A:
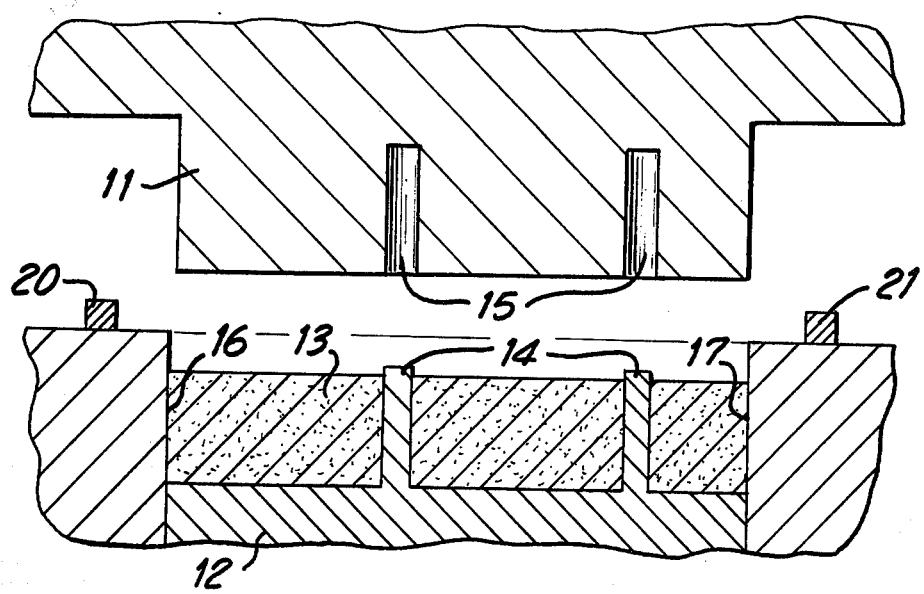
FIG. 2 details of a mould making it possible to obtain a substrate according to FIG. 1.
Figure 2B:
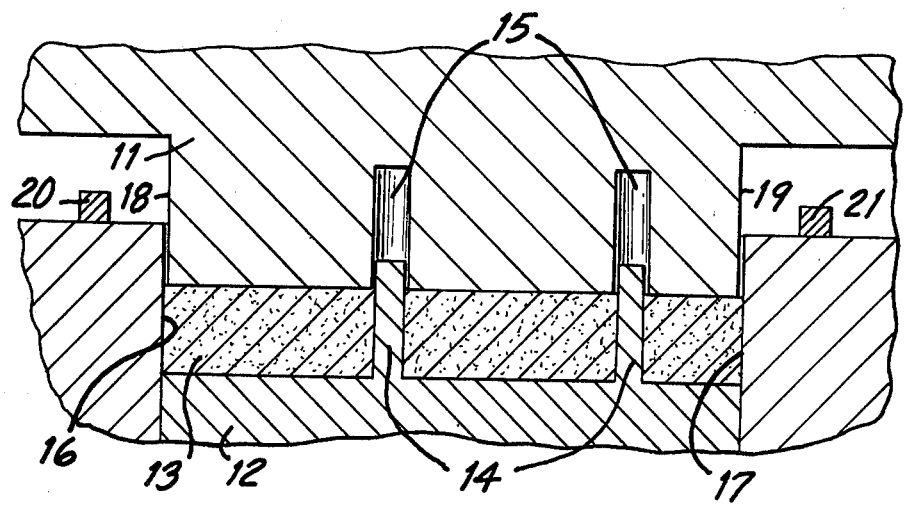
Figure 2C:
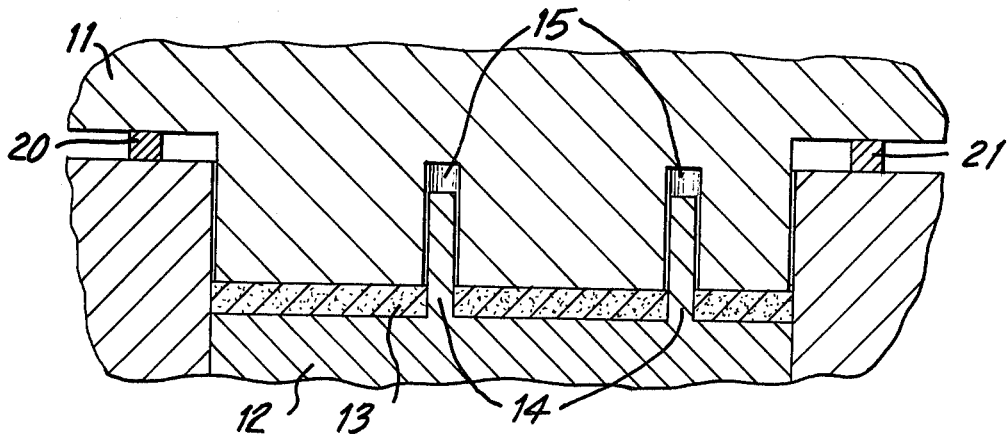

FIG. 2 shows details of the mould making it possible to obtain a substrate according to the invention and the various pressing stages. In FIGS. 2A, 2B and 2C 11 is the upper cavity of the mould, 12 the lower cavity, 14 and 15 respectively the male and female pins of the mould, which are complementary with one another and 13 the ceramic composition according to the invention. The latter is placed in the lower part 12 of the mould having side walls 16, 17 retaining the ceramic composition. After pressing, the height of the latter is less than that of the male pins 14 in such a way as to produce the holes in the substrate during pressing. The upper part 11 of the mould slides by its side walls 18, 19 along walls 16, 17 of the lower part 12 of the mould. In FIG. 2C, the abutments diagrammatically represented by 20 and 21 stop the relative movement of the upper and lower parts, determining the end of pressing. It is pointed out that the ceramic granulated material is correctly distributed in the mould during pressing with the composition according to the invention and without porosity in the substrate.

The compositions make it possible to achieve this result are illustrated below.

EXAMPLE 1

The following compounds are mixed for 10 hours in an alumina ball mill:

| | |
|---|---|
| First alumina of grain size below 2 microns, which can be fritted at a temperature of 1450 to 1590° C., for a bulk density of 2.00 to 2.20: | 77.4% by weight |
| Second alumina with a grain size below 3 microns, which can be fritted at a temperature of 1580 to 1650° C. for a bulk density of 2.20 to 2.30: | 19% |
| Butyl polyacrylate (in 50% aqueous dispersion): | 1.1% |
| Polyvinyl alcohol (in 20% solution): | 0.1% |
| Polyethylene (in 20% aqueous dispersion): | 1.4% |
| Organic deflocculating agents: | 0.5% |

Water is added to the mixture in such a way as to obtain a dry material: slip ratio of approximately 65 to 70%. The mixture must be prepared, whilst ensuring the balance of the preparation at all times.

The thus obtained slip is then atomized and, after screening, a granulated material of grain size between 80 and 250 microns is obtained.

This granulated material is used for mechanically pressing in a mould a 2.54×2.54 cm substrate having 48 calibrated holes (FIG. 1). The substrate has a bulk density of 2.45 and is fritted at a temperature of 1580° C. Fritting lasts approximately 30 minutes and the temperature profile of the furnaces passes from 20° C. to 1580° C. and then to 20° C., which gives a fritting time of approximately 15 hours. The finished density of the substrate is 3.90. After auto-polishing in a drum containing water for 6 hours, substrates are obtained having an average roughness, measured with the aid of a profilometer by the conventional process, of approximately 0.2 micron (0 micro-inch).

EXAMPLE 2

The procedure of Example 1 is followed using the following composition in dry extract form:

| | |
|---|---|
| First alumina: | 70% by weight |
| Second alumina: | 22% |
| Butyl polyacrylate (in 50% dispersion): | 0.9% |
| Carboxymethyl cellulose: | 0.9% |
| Polyvinyl alcohol (in 20% solution): | 0.2% |
| Organic deflocculating agents: | 0.5% |
| Talc: | 3% |

Proceeding as hereinbefore, substrates are obtained with a roughness substantially equal to 0.2 micron ($R_a$) with bulk and finished densities of respectively 2.45 and 3.87.

What is claimed is:

1. A process for producing a ceramic substrate for electronic components provided with holes, said substrate having a roughness of less than 10 microinch, comprising the steps of:
   (1) Mixing in an aqueous medium to form a composition of from about 97 to 98.5 percent by weight of a mixture of:
      (a) from about 65 to 95 percent by weight of a first alumina material having a grain size of from about 0.4 to 0.8 micron and a density of from about 2 to 2.20 which has been fired at a temperature of from about 1450° C. to 1580° C. to produce an alumina material having a density after firing of from about 3.85 to 3.96; and (b) From about 34 to 5 percent by weight of a second alumina material having a grain size of from about 1.2 to 1.6 microns and a density of from about 2.2 to 2.3 which has been fired at a temperature of from about 1580° C. to 1650° C. to produce an alumina material having a density of from about 3.85 to 3.96; and (c) From about 1.5 to 3 percent by weight of organic compounds comprising a deflocculating agent and an organic binder selected from the group consisting of butyl polyacrylates and copolymers thereof;

(2) Atomizing said composition;

(3) Screening the resulting composition to produce a granulated material having a grain size of from about 80 to 250 microns;

(4) Mechanically compressing said composition in a mold to produce an unfired substrate having holes to conform to the desired configuration of said substrate;

(5) Firing said substrate at a temperature of about 1580° C.; and (6) Auto-polishing a plurality of said so fired substrates in the presence of water.

2. A process according to claim 1, wherein the mixture of alumina comprises from about 70 to 80% by weight of the first alumina and 30 to 20% by weight of the second alumina.

3. A process according to claim 2, which further comprises the steps of adding during mixing in aqueous medium from about 0 to 5% by weight of the ceramic composition in dry extract form, mineral products having a grain size below 2 microns.

* * * * *